United States Patent [19]
Hays et al.

[11] Patent Number: 5,854,122
[45] Date of Patent: Dec. 29, 1998

[54] EPITAXIAL LAYER FOR DISSOLVED WAFER MICROMACHINING PROCESS

[75] Inventors: Kenneth Maxwell Hays, Anaheim, Calif.; Bradley Leonard Halleck, Salem, Oreg.; Eugene Coleman Whitcomb, Mission Viejo, Calif.

[73] Assignee: The Boeing Company, Seattle, Wash.

[21] Appl. No.: 816,651

[22] Filed: Mar. 13, 1997

[51] Int. Cl.⁶ .............................. H01L 21/30; H01L 21/46
[52] U.S. Cl. ..................... 438/459; 438/455; 438/50; 438/52; 438/53; 438/57
[58] Field of Search ................... 438/50, 52, 53, 438/57, 455, 459

[56] References Cited

PUBLICATIONS

Wolf et al., Silicon Processing for the VLSI Era, vol. 1—Process Technology, 1986, p. 124.

*Primary Examiner*—John Niebling
*Assistant Examiner*—David A. Zarneke
*Attorney, Agent, or Firm*—Charles T. Silberberg; Tom Streeter

[57] ABSTRACT

Micromachining a microelectromechanical structure requires one or more heavily doped silicon layers. Intricately patterned structures are created in a heavily doped surface layer on a relatively undoped substrate. The substrate is subsequently dissolved in a selective etch. The doping prevents the patterned structures from dissolving. In this invention, a doped layer is grown epitaxially onto the first substrate rather than by diffusing a dopant into the substrate. This produces additional planarity, thickness control, and dopant profile control. The structure may then be placed into a larger device, such as an infrared sensor, an accelerometer, or an angular rate sensor.

18 Claims, 7 Drawing Sheets

EPITAXIAL LAYER FOR DISSOLVED WAFER MICROMACHINING PROCESS

BACKGROUND OF THE INVENTION

This invention relates to the manufacture of microelectromechanical structures and has particular relation to the dissolved wafer micromachining process for doing so.

Micromachining a microelectromechanical structure (which may be microelectrical, micromechanical, or both) using the dissolved wafer micromachining process requires one or more heavily doped silicon layers. Intricately patterned structures are created in a heavily doped surface layer on a relatively undoped silicon substrate. The substrate is subsequently dissolved in a selective etch. The doping prevents the patterned structures from dissolving.

Conventionally, such doping is accomplished by thermal diffusion. It is often impossible to dope the substrate as deeply or as heavily as desired. Even when it is possible, the composition and boundaries of the layers thus formed are not easily controlled. The subsequent micromachining suffers accordingly.

FIGS. 1–6 show the limitations of the prior art.

Figure 1:
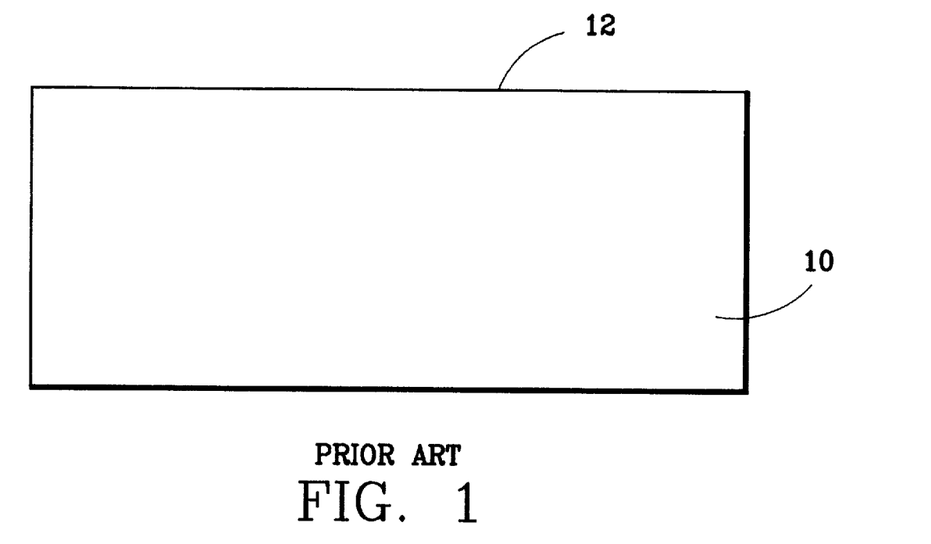
FIG. 1 shows a cross section of a prior art first substrate 10 before processing.

FIG. 1 shows a cross section of a prior art first substrate 10 before processing. The first substrate 10 is typically silicon, but other materials may be used as required. The surface 12 may be doped or undoped as desired. Only two things are required. First, the substrate surface 12 must be capable of being doped (or further doped). Second, the resulting doped (or further doped) surface layer must be more resistant to dissolution than the undoped (or partially doped) interior of the first substrate.

Figure 2:
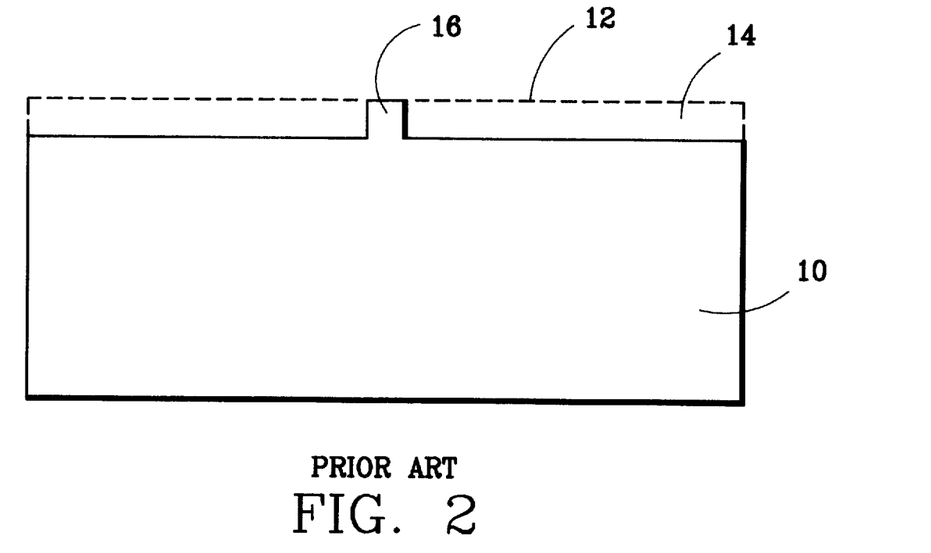
FIG. 2 shows the structure of FIG. 1 after a thin layer 14 has been removed from its surface 12.

FIG. 2 shows the structure of FIG. 1 after a thin layer 14 has been removed from its surface 12 except at one location, leaving a small bump 16 at that location. The dotted lines in this and subsequent figures indicate the original surface 12 of the first substrate 10. Removal may be accomplished by using conventional photolithography and etching techniques or by any other convenient method.

Figure 3:
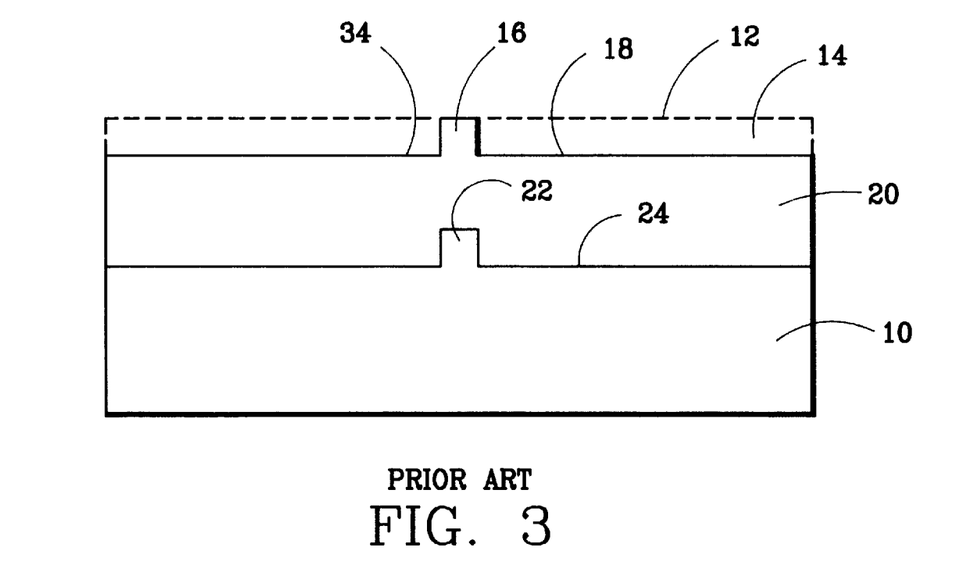
FIG. 3 shows the structure of FIG. 2 after a dopant, typically boron, has been diffused into its surface 12.

FIG. 3 shows the structure of FIG. 2 after a dopant, typically boron, has been diffused into its surface 12. Diffusion takes place to a generally uniform depth below the surface 12. The small bump 16 on the upper surface 18 of the diffusion layer 20 therefore leaves behind an undesired, but tolerable, small bump 22 on the lower surface 24 of the diffusion layer 20.

Figure 4:
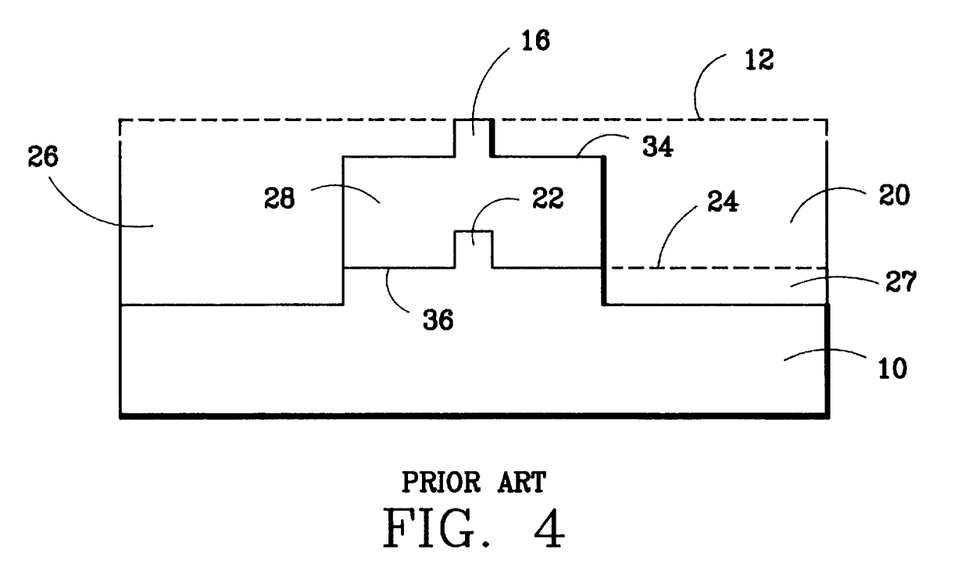
FIG. 4 shows the structure of FIG. 3 after a thick layer 26 has been removed from its surface.

FIG. 4 shows the structure of FIG. 3 after a thick layer 26 has been removed from its surface. An area surrounding the upper small bump 16 has been omitted. This leaves a large patterned structure 28 supporting the upper small bump 16. The thick layer 26 includes both the diffusion layer 20 and a layer 27 from the undoped portion of the first substrate 10. As before, removal may be accomplished by using conventional photolithography and etching or by any other convenient method.

Figure 5:
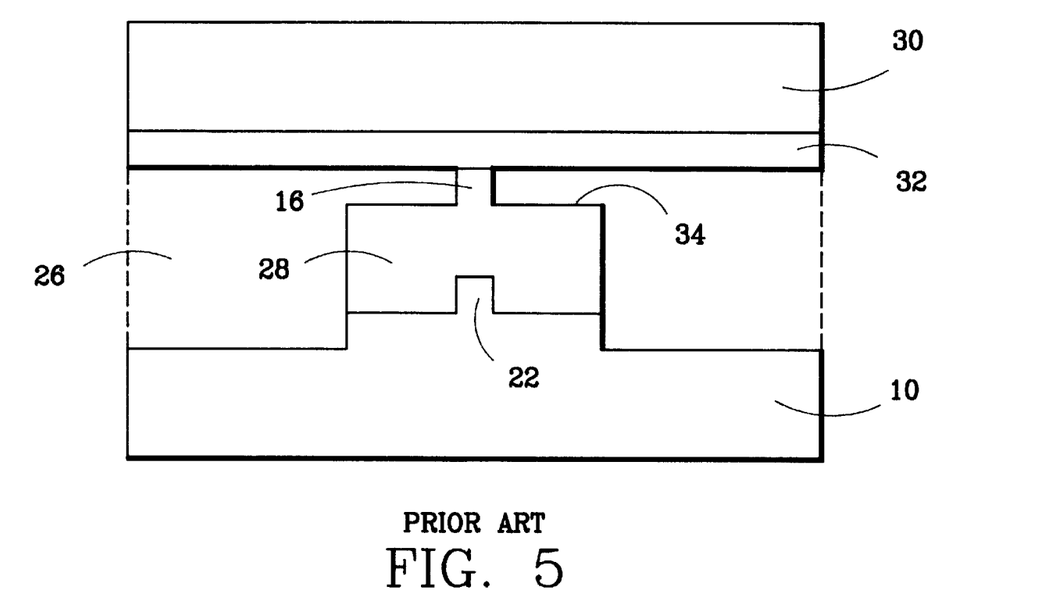
FIG. 5 shows a second substrate 30 bonded to the upper small bump 16 of FIG. 4.

FIG. 5 shows a second substrate 30 bonded to the upper small bump 16 of FIG. 4. The second substrate 30, or at least its surface 32, has a composition different from that of the first substrate 10.

Figure 6:
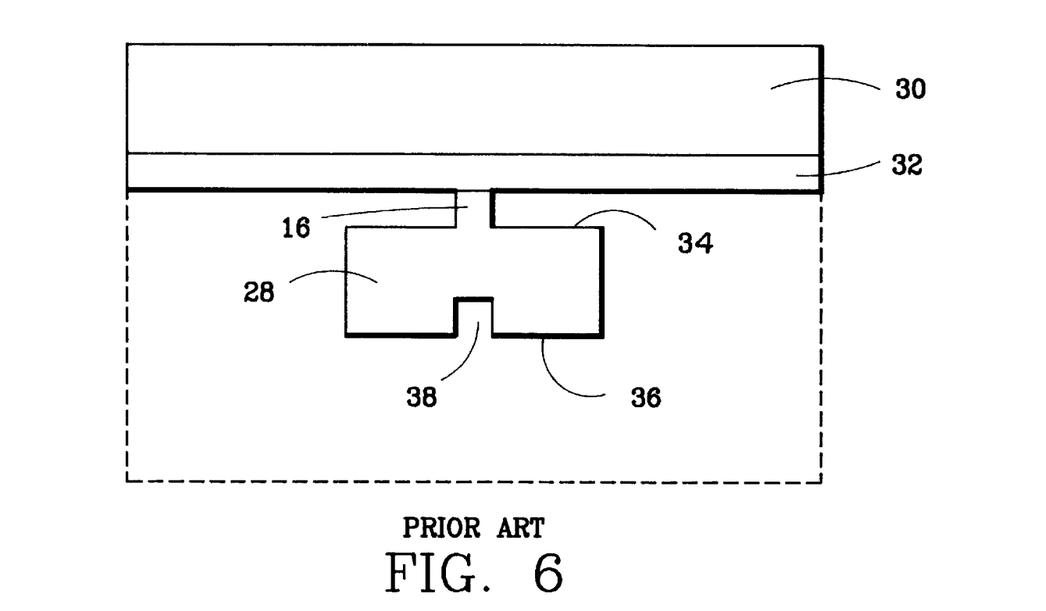
FIG. 6 shows the structure of FIG. 5 after the first substrate 10 has been dissolved away.

FIG. 6 shows the second substrate 30 of FIG. 5 bonded to the upper small bump 16, which in turn supports the doped portion of the large patterned structure 28. The (undoped) first substrate 10, together with the undoped portion of the large patterned structure 28 have been dissolved away. A solvent has been used which attacks the material of the undoped portion of the first substrate 10, but not the material of the second substrate 30 (or, at least, its surface 32). It also does not attack the material of the upper small bump 16 and the doped portion of the large patterned structure 28.

The structure shown in either FIG. 3 or FIG. 4 may have microelectromechanical components formed on the upper surface 34 (the surface facing away from the first substrate 10) of the large patterned structure 28. The structure shown in FIG. 6 may have microelectromechanical components formed on the lower surface 36 (the surface facing away from the second substrate 30) of the large patterned structure 28.

The lower small bump 22 creates a pit 38 in the lower surface 36 of the large patterned structure 28. This is undesirable, but it is a necessary byproduct of the formation of the upper small bump 16. The upper small bump 16 is desirable because it separates the upper surface 34 of the large patterned structure 28 from the surface 32 of the second substrate 30. This allows microelectromechanical components to be formed both on the upper surface 34 of the large patterned structure 28 and on the surface 32 of the second substrate 30, or for the large patterned structure 28 to serve as a microelectromechanical component itself. These microelectromechanical components may be formed, and may operate, without interfering with each other. It also allows the upper 34 and lower 36 surfaces of the large patterned structure 28, which may be relatively planar, to remain so. The surface 32 of the second substrate 30 may be not nearly as planar as the surfaces 34, 36 of the large patterned structure 28. Bonding the large patterned structure 28 directly to the surface 32 of the second substrate 30 (without the upper small bump 16) would cause a problem. The surface 34 of the large patterned structure 28 would be joined to the surface 32 of the second substrate 30. This would prevent the large patterned structure 28 from serving as a flexible microelectromechanical structure, or would damage microelectromechanical components on surface 34.

The first 10 and second 30 substrates are generally each a part of a much larger wafer. A large number of bumps 16 and patterned structures 28 (and their associated components) may thus be manufactured simultaneously. The dissolving of the first substrate 10, between FIGS. 5 and 6, is thus the dissolving of an entire wafer. It is for this reason that this is called the "Dissolved Wafer Micromachining Process". See Bernstein et al., "A Micromachined Comb-Drive Tuning Fork Rate Gyroscope," IEEE Proceedings on Micro Electro Mechanical Systems, pp. 143–148, Feb. 7, 1993.

This conventional process has a number of drawbacks. There is an undesirable pit 38 present. The dopant profile of the large patterned structure 28 is not easily controlled. There is little control over the thickness of the large patterned structure 28. The large patterned structure's surfaces 34, 36, and especially the lower surface 36, are non-planar.

BRIEF SUMMARY OF THE INVENTION

Applicants have overcome these drawbacks by growing a doped layer epitaxially onto the first substrate rather than by diffusing a dopant into the substrate. This provides at least four benefits.

First, the width of the transition region between the substrate and the doped layer is generally narrower. This improves the control and uniformity of the thickness of the finished device.

Second, the transition region between the substrate and the doped layer is generally smoother. The rough texture which is characteristic of diffusion is avoided This improves the overall design flexibility, and may facilitate the fabrication of smoothness-dependent structures, e.g. micromirrors.

Third, the doped layers can more readily be compensated with a second dopant to relieve strain. Strain tends to degrade the performance of the finished device. It also tends to impose inconvenient design constraints, such as size limits.

Fourth, it enhances control over the dopant density as a function of thickness (dopant profile) within the doped layer. Uniformity of a thick layer is much easier to obtain by epitaxy than by diffusion. Control of the wall profile in the subsequent pattern etch steps is much easier if the dopant profile is uniform or, in some applications, follows some specially-tailored function. Such special tailoring is also much easier to obtain by epitaxy than by diffusion.

DETAILED DESCRIPTION OF THE INVENTION

FIGS. 1–6 describe the prior art, and will not be further discussed.

Figure 7:
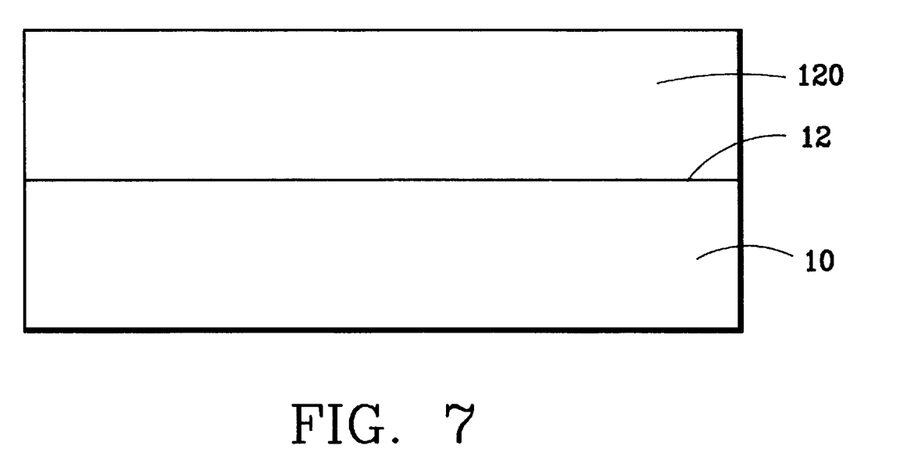
In FIG. 7, an epitaxial layer 120 according to the present invention is grown on the first substrate of FIG. 1.

In FIG. 7, an epitaxial doped layer 120 is grown on the surface 12 of the first substrate 10 of FIG. 1. The first substrate 10 should have its surface 12 be polished or otherwise formed to have the planarity desired of the ultimate end product.

Layer growth may be accomplished by molecular beam epitaxy (MBE), chemical vapor deposition (CVD), metal organic chemical vapor deposition (MOCVD), or any other convenient epitaxial process. If the substrate is 100% silicon, the epitaxial doped layer may conveniently be about 0.1% boron, 0.5% to 1.0% germanium, and the remainder silicon. However, the doped layer 120 may have any desired dopant profile, and any desired thickness, within the capabilities of the reactor used to form same.

It is the boron dopant which allows the bump 116 and patterned structure 128 to remain after the silicon wafer (first substrate 10) has been dissolved. However, boron atoms are smaller than silicon atoms. This leads to a mismatch in lattice size between the first substrate and the epitaxial layer, which creates cracks and other defects. Germanium atoms are larger, and offset the mismatch by providing strain relief. Other materials may be used as dopants, strain relievers, and substrates, and other concentrations of existing materials may be used. In either event, the concentrations of the other materials should be adjusted accordingly.

Figure 8:
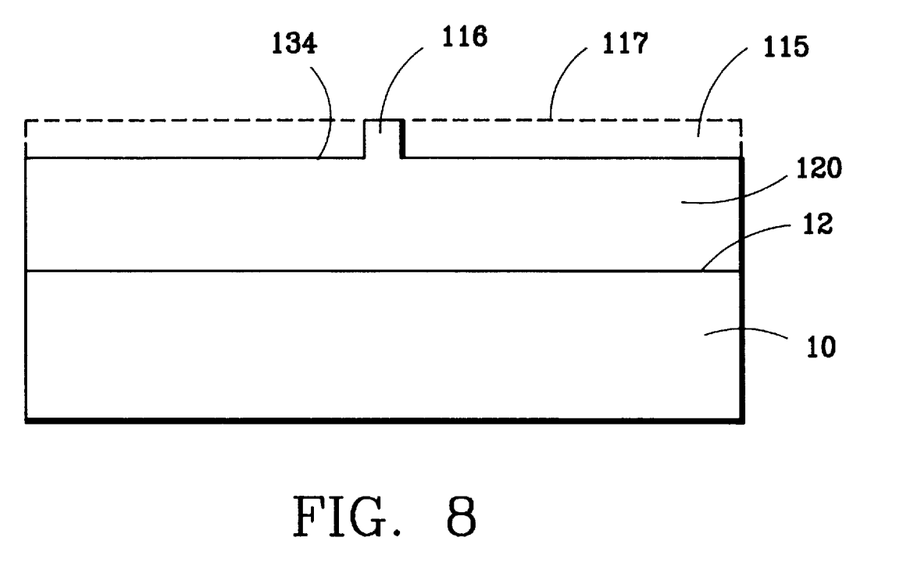
FIG. 8 parallels FIG. 2, and shows the etching of a small bump 1 16 in FIG. 7's epitaxially layer 120.

FIG. 8 parallels FIG. 2. It shows the etching of a small bump 116 on the surface 117 of FIG. 7's epitaxially layer 120. FIG. 2, in contrast, shows the etching of an upper small bump 16 on FIG. 1's first substrate 10. Note that FIG. 8 shows only a single small bump 116, not the two small bumps, upper 16 and lower 22, of FIGS. 3–5.

Figure 9:
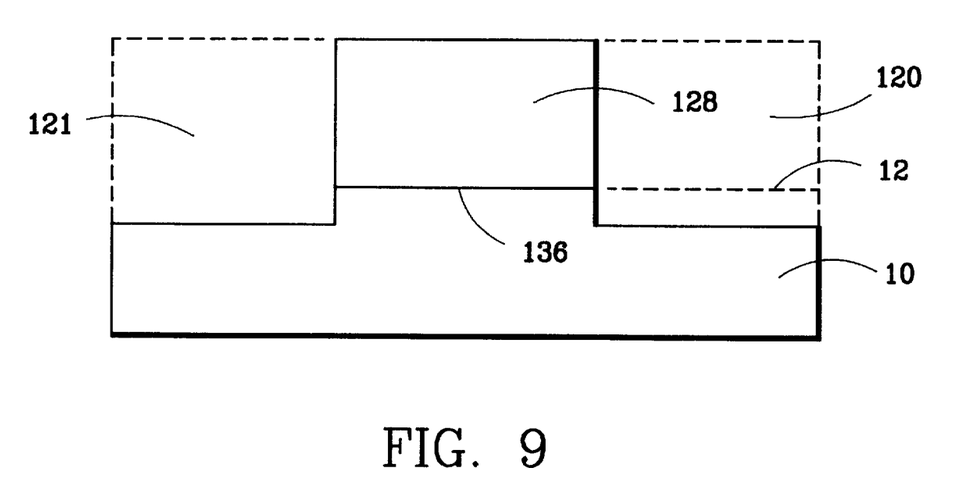
FIG. 9 is an alternate to FIG. 8, and shows the large patterned structure 128 being formed before the small bump 116 is formed.

FIG. 9 is an alternate to FIG. 8, and shows the large patterned structure 128 being formed before the small bump 116 is formed. The small bump 116 may then be etched onto the top of the large patterned structure 128.

Thus, in FIG. 9, the worker first etches fully through selected portions of the doped layer 120, the unetched portion thereby defining the partially raised portion (the large patterned structure 128). He then etches partially through selected portions 119 of the partially raised portion (the large patterned structure 128). The unetched portion thereby defines the fully raised portion (the small bump 116). This is the reverse of FIG. 8, in which the worker first etches partially through selected portions 1 5 of the doped layer 120. The unetched portion thereby defines the fully raised portion (the small bump 116). The worker then etches fully through selected portions 121 of the doped layer, exclusive of the fully raised portion 116. The unetched portion thereby defines the partially raised portion (the large patterned structure 128).

Figure 10:
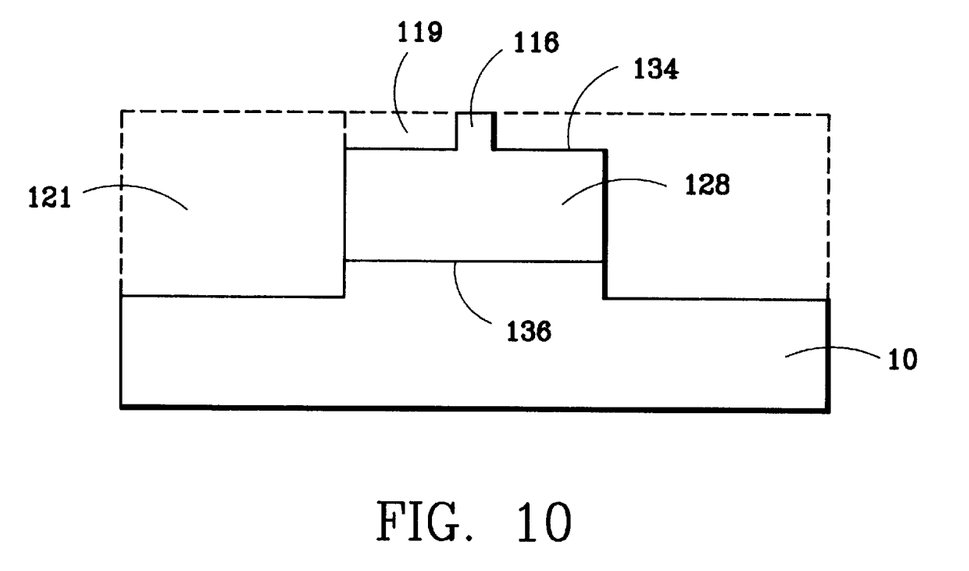
FIG. 10 parallels FIG. 4, again showing the etching of the large patterned structure 128 and small bump 116.

FIG. 10 parallels FIG. 4. It shows the etching of the large patterned structure 128 around the small bump 116 (if preceded by FIG. 8). Alternatively, it shows the etching of the small bump 116 on top of the large patterned structure 128 (if preceded by FIG. 9). In either case, a fully raised portion (the small bump 116) on a partially raised portion (the large patterned structure 128) is etched on the doped layer 120. The remainder 121 of the doped layer 120 is etched away. Note that lower surface 136 of the doped portion of the large patterned structure 128 is planar, and includes no pit 38 or lower small bump 22.

It would be possible to use the steps shown in FIGS. 8–10 on a conventional diffused layer 20 rather than on the epitaxially grown layer 120 of the present invention. In this fashion, the worker could avoid the lower small bump 22 and resulting pit 38. However, the lower surface 24 of a conventional diffused layer 20 is so non-planar that the presence of the pit 38 is only a small additional drawback.

Figure 11:
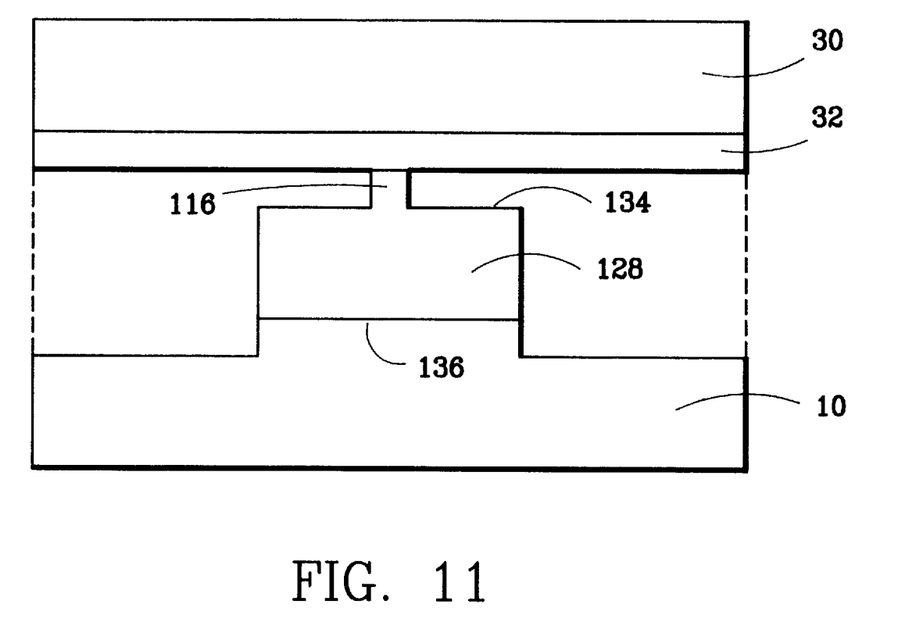
FIG. 11 parallels FIG. 5, and shows the structure of FIG. 10 being bonded to the second substrate 30.

FIG. 11 parallels FIG. 5, and shows the fully raised portion (the small bump 116) of FIG. 10 being bonded to the second substrate 30. The partially raised portion (the large patterned structure 128) is thereby bonded to the second substrate 30 by the fully raised portion (the small bump 116).

The second substrate in either FIG. 11 or FIG. 5 may have any of a variety of microelectromechanical components formed on its surface 32.

Figure 12:
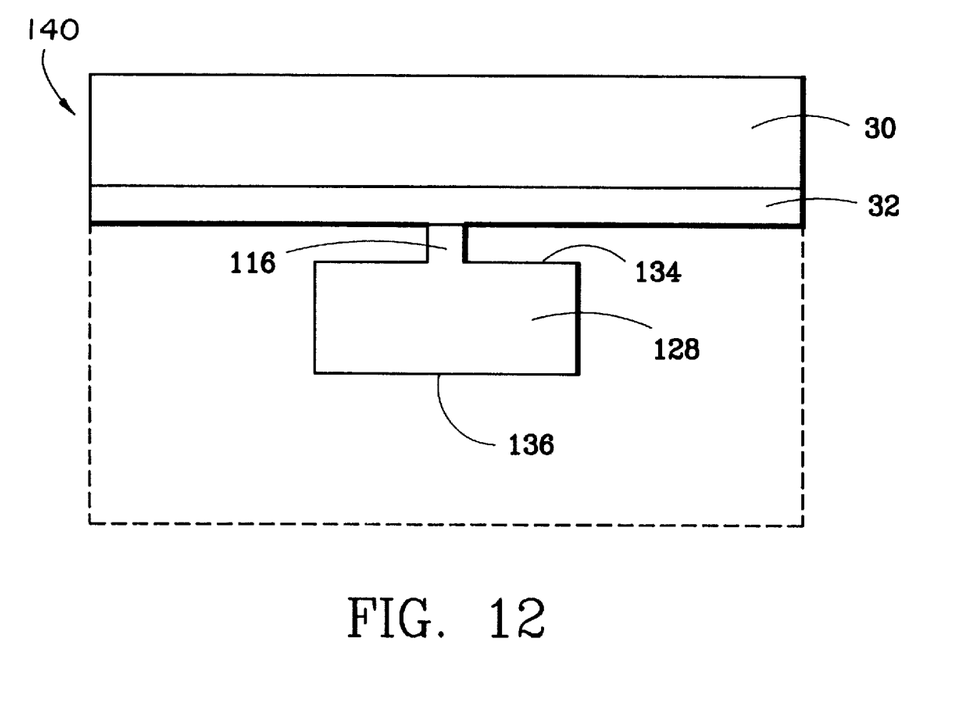
FIG. 12 parallels FIG. 6, and shows the structure of FIG. 11 after the first substrate 10 has been dissolved away.

FIG. 12 parallels FIG. 6. It shows the structure of FIG. 11 after the first substrate 10 has been dissolved away. The dissolution process does not dissolve the doped layer 120 or the second substrate 30 (or, at least, its surface 32). The partially raised portion (the large patterned structure 128) thereby forms a patterned layer which has the desired thickness and dopant profile (both vertically and horizontally), and a lower surface 136 of the desired planarity.

As with the structures of FIGS. 3, 4, and 6, the structures shown in either FIG. 8 or FIG. 10 may have microelectromechanical components formed on the upper surface 134 (the surface facing away from the first substrate 10) of the large patterned structure 128, or the large patterned structure may itself serve as a microelectromechanical structure. Likewise, the structure shown in FIG. 12 may have microelectromechanical components formed on the lower surface 136 (the surface facing away from the second substrate) of the large patterned structure 128.

The etching of a small bump 116 and large patterned structure 128 is preferred, but only exemplary. A cross section through FIG. 10's large patterned structure 128, parallel to the surface of the first substrate 10, need not be a circle, and need not have a small radius. It may be of any size or shape which the worker finds convenient, and which he can form using the photolithographic or other techniques available to him. There may be several large patterned structures 128 on a single substrate 10.

Likewise, a cross section through FIG. 10's small bump 116, parallel to the surface 12 of the first substrate 10, need not be a circle of even smaller radius, as are implied by the term "small bump". It likewise may be of any size or shape which the worker finds convenient, and which he can form using the photolithographic or other techniques available to him. The broader term "fully raised portion" is more descriptive. There may be several fully raised portions on a single partially raised portion.

Figure 13:
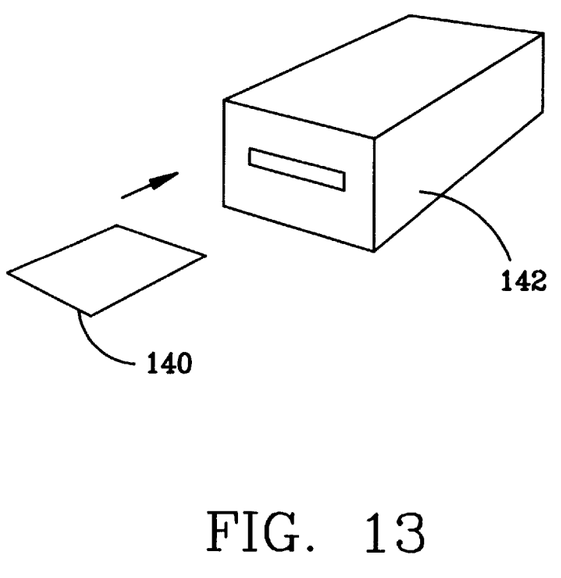
FIG. 13 shows the structure 140 of FIG. 12 being inserted into a larger device 142.

FIG. 13 shows the structure 140 of FIG. 12 being inserted into a larger device 142. The device 142 may be an infrared sensor, and inertial measurement unit (such as an accelerometer or an angular rate sensor), or any other device which the worker finds convenient.

Although several embodiments of this invention have been shown, the true spirit and scope of the invention are not limited thereto. They are limited only by the following claims and their equivalents, and we claim such as our invention.

We claim:

1. A process comprising the steps of:
   (a) creating a doped layer, of a desired thickness and dopant profile, on a surface of a first substrate, the surface having a desired planarity;
   (b) etching a fully raised portion on a large patterned structure portion on the doped layer, the remainder of the doped layer being etched away;
   (c) bonding the fully raised portion to a second substrate; and
   (d) dissolving the first substrate in a process which does not dissolve the doped layer or the second substrate;
   the large patterned structure portion thereby forming a patterned layer of desired thickness and dopant profile, the large patterned structure portion thereby being bonded to the second substrate by the fully raised portion, and the large patterned structure portion having a surface of desired planarity.

2. The process of claim 1, wherein the etching step comprise the steps of:
   (a) etching fully through selected portions of the doped layer, the unetched portion thereby defining the large patterned structure portion; and
   (b) etching partially through selected portions of the large patterned structure portion, the unetched portion thereby defining the fully raised portion.

3. The process of claim 1, wherein the etching step comprise the steps of:
   (a) etching partially through selected portions of the doped layer, the unetched portion thereby defining the fully raised portion; and
   (b) etching fully through selected portions of the doped layer, exclusive of the fully raised portion, the unetched portion thereby defining the large patterned structure portion.

4. The process of claim 1, further comprising the step of including the large patterned structure portion, the second substrate, and the fully raised portion, within a microelectromechanical device.

5. The process of claim 4, wherein the microelectromechanical device is an infrared sensor, an accelerometer, or an angular rate sensor.

6. The process of claim 2, further comprising the step of including the large patterned structure portion, the second substrate, and the fully raised portion, within a microelectromechanical device.

7. The process of claim 6, wherein the microelectromechanical device is an infrared sensor, an accelerometer, or an angular rate sensor.

8. The process of claim 3, further comprising the step of including the large patterned structure portion, the second substrate, and the fully raised portion, within a microelectromechanical device.

9. The process of claim 8, wherein the microelectromechanical device is an infrared sensor, an accelerometer, or an angular rate sensor.

10. The process of claim 1, wherein the step of creating the doped layer comprises the step of epitaxially growing the doped layer.

11. The process of claim 2, wherein the step of creating the doped layer comprises the step of epitaxially growing the doped layer.

12. The process of claim 3, wherein the step of creating the doped layer comprises the step of epitaxially growing the doped layer.

13. The process of claim 4, wherein the step of creating the doped layer comprises the step of epitaxially growing the doped layer.

14. The process of claim 5, wherein the step of creating the doped layer comprises the step of epitaxially growing the doped layer.

15. The process of claim 6, wherein the step of creating the doped layer comprises the step of epitaxially growing the doped layer.

16. The process of claim 7, wherein the step of creating the doped layer comprises the step of epitaxially growing the doped layer.

17. The process of claim 8, wherein the step of creating the doped layer comprises the step of epitaxially growing the doped layer.

18. The process of claim 9, wherein the step of creating the doped layer comprises the step of epitaxially growing the doped layer.

* * * * *